(12) United States Patent
Nakamura

(10) Patent No.: US 11,177,591 B2
(45) Date of Patent: Nov. 16, 2021

(54) CONNECTING METHOD, CONNECTING STRUCTURE AND CONNECTION TERMINAL

(71) Applicant: Japan Aviation Electronics Industry, Limited, Tokyo (JP)

(72) Inventor: Keisuke Nakamura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 8 days.

(21) Appl. No.: 16/726,567

(22) Filed: Dec. 24, 2019

(65) Prior Publication Data

US 2020/0266563 A1 Aug. 20, 2020

(30) Foreign Application Priority Data

Feb. 18, 2019 (JP) .............................. JP2019-026635

(51) Int. Cl.
| | |
|---|---|
| *H01R 12/65* | (2011.01) |
| *H01R 12/57* | (2011.01) |
| *H01R 12/70* | (2011.01) |
| *H01R 12/79* | (2011.01) |
| *H01R 13/24* | (2006.01) |

(Continued)

(52) U.S. Cl.
CPC ............. *H01R 12/65* (2013.01); *H01R 12/57* (2013.01); *H01R 12/7011* (2013.01); *H01R 12/79* (2013.01); *H01R 13/24* (2013.01); *H05K 1/028* (2013.01); *H05K 1/118* (2013.01); *H05K 2201/098* (2013.01)

(58) Field of Classification Search
CPC .... H01R 12/675; H01R 4/2425; H01R 12/62; H01R 12/63; H01R 12/616; H01R 4/2404; H01R 12/67; H01R 43/01; H01R 12/592
See application file for complete search history.

(56) References Cited

U.S. PATENT DOCUMENTS 3,997,233 A 12/1976 Evans
4,560,224 A * 12/1985 Weisenburger ...... H01R 4/2495
439/422

(Continued)

FOREIGN PATENT DOCUMENTS

EP 1139492 A2 10/2001
JP 2005063872 A 3/2005

*Primary Examiner* — Jean F Duverne
(74) *Attorney, Agent, or Firm* — Muncy, Geissler, Olds & Lowe, P.C.

(57) ABSTRACT

A connecting method includes: arranging the connection terminal such that a rear surface of a base portion in a flat plate shape of the connection terminal comes into contact with a front surface of the flexible substrate; with a rising portion of the connection terminal extending from the rear surface side of the base portion toward the base portion and a tip end bending portion of the connection terminal extending from a tip end of the rising portion in a direction inclined with respect to the rising portion, displacing the rising portion toward the base portion so that the tip end bending portion protrudes from a front surface of the base portion; and holding a part of the flexible substrate between a pressing portion formed at the rising portion and a pressed portion formed at the base portion, whereby the conductive portion of the flexible substrate is electrically connected to at least one of the pressing portion and the pressed portion.

18 Claims, 16 Drawing Sheets

(51) Int. Cl.
*H05K 1/02* (2006.01)
*H05K 1/11* (2006.01)

(56) References Cited

U.S. PATENT DOCUMENTS

| | | | | |
|---|---|---|---|---|
| 4,832,620 A | * | 5/1989 | Yamamoto | H01R 12/68 |
| | | | | 439/422 |
| 6,439,921 B1 | * | 8/2002 | Hio | H01R 12/68 |
| | | | | 439/397 |
| 7,410,384 B2 | * | 8/2008 | Shuey | H01R 12/68 |
| | | | | 439/421 |

* cited by examiner

CONNECTING METHOD, CONNECTING STRUCTURE AND CONNECTION TERMINAL

BACKGROUND OF THE INVENTION

The present invention relates to a connecting method, particularly to a connecting method for connecting a connection terminal to an end of a flexible substrate having a conductive portion exposed on at least one of the surfaces thereof.

The present invention also relates to a connecting structure and a connection terminal.

As an example of a connecting structure for connecting a connection terminal to a conductive portion of a flexible substrate, JP2005-63872 A discloses a flat cable connection portion 1 as illustrated in FIG. 49. The flat cable connection portion 1 includes a base 3 and a cover 4 that are made of resin and constitute a housing where a connecting part of a flat cable 2 is accommodated, a metal plate 6 fitted in the base 3 and provided with a slot 5, and a metal connection part 8 having a piercing part 7. The flat cable 2 is held between the base 3 and the cover 4 while being in contact with the surface of the plate 6.

When the flat cable 2 is pierced with the piercing part 7 of the connection part 8 via a guide hole 4A of the cover 4, a flat conductor 9 in the flat cable 2 is sheared by the piercing part 7, and with insertion of the piercing part 7, a sheared portion of the flat conductor 9 is pressed into the slot 5 of the plate 6 together with the piercing part 7 and as a fractured extension part 9A, comes into contact with the piercing part 7. The connection part 8 and the flat conductor 9 are electrically connected in this manner.

As illustrated in FIG. 49, however, since the piercing part 7 extending in a direction perpendicular to the flat cable 2 pierces the flat cable 2, it has been difficult to surely obtain a sufficient length L in the direction in which the fractured extension part 9A is pressed into the slot 5 of the plate 6 together with the piercing part 7. Accordingly, reliability of the electrical connection between the flat conductor 9 and the connection part 8 may be impaired.

SUMMARY OF THE INVENTION

The present invention has been made to overcome the conventional problem as above and aims at providing a connecting method that makes it possible to connect a connection terminal to a conductive portion of a flexible substrate with superior reliability.

The present invention also aims at providing a connecting structure obtained by use of the connecting method, as well as a connection terminal for use in the connecting method.

The method according to the present is a connecting method for connecting a connection terminal having conductivity to an end of a flexible substrate, the flexible substrate having a conductive portion exposed on at least one of surfaces of the flexible substrate, the method comprising: arranging the connection terminal such that a rear surface of a base portion in a flat plate shape of the connection terminal comes into contact with a front surface of the flexible substrate; with a rising portion of the connection terminal extending from the rear surface side of the base portion toward the base portion and a tip end bending portion of the connection terminal extending from a tip end of the rising portion in a direction inclined with respect to the rising portion, displacing the rising portion toward the base portion so that the tip end bending portion protrudes from a front surface of the base portion; and holding a part of the flexible substrate between a pressing portion formed at the rising portion and a pressed portion formed at the base portion, whereby the conductive portion of the flexible substrate is electrically connected to at least one of the pressing portion and the pressed portion.

The connecting structure according to the present invention is a connecting structure, in which a connection terminal having conductivity is connected to an end of a flexible substrate, the flexible substrate having a conductive portion exposed on at least one of surfaces of the flexible substrate, wherein the connection terminal includes a base portion in a flat plate shape having a front surface and a rear surface facing in opposite directions to each other, a rising portion extending from the rear surface side of the base portion toward the base portion, and a tip end bending portion extending from a tip end of the rising portion in a direction inclined with respect to the rising portion, wherein the rising portion includes a pressing portion, wherein the base portion includes a pressed portion, and wherein, with the rear surface of the base portion being in contact with a front surface of the flexible substrate, a part of the flexible substrate is held between the pressing portion and the pressed portion, whereby the conductive portion of the flexible substrate is electrically connected to at least one of the pressing portion and the pressed portion.

The connection terminal according to the present invention is a connection terminal having conductivity and connected to an end of a flexible substrate, the flexible substrate having a conductive portion exposed on at least one of surfaces of the flexible substrate, the connection terminal comprising: a base portion in a flat plate shape having a front surface and a rear surface facing in opposite directions to each other; a rising portion extending from the rear surface side of the base portion toward the base portion; and a tip end bending portion extending from a tip end of the rising portion in a direction inclined with respect to the rising portion, wherein the rising portion includes a pressing portion, wherein the base portion includes a pressed portion, and wherein, with the rear surface of the base portion being in contact with a front surface of the flexible substrate, a part of the flexible substrate is held between the pressing portion and the pressed portion, whereby the conductive portion of the flexible substrate is electrically connected to at least one of the pressing portion and the pressed portion.

DETAILED DESCRIPTION OF THE INVENTION

Embodiments of the present invention are described below based on the appended drawings.

Embodiment 1

Figure 1:
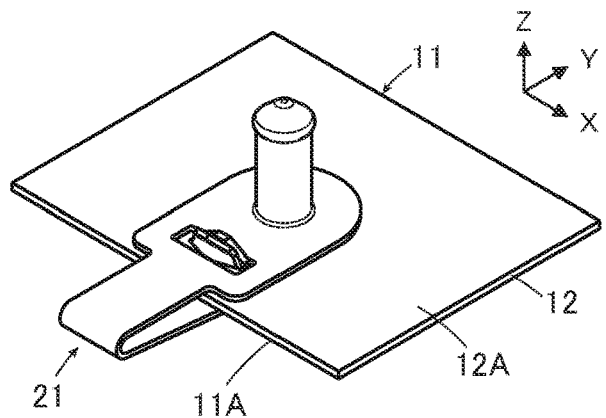
FIG. 1 is a perspective view of a connecting structure according to Embodiment 1 when viewed from an obliquely upper position.
Figure 2:
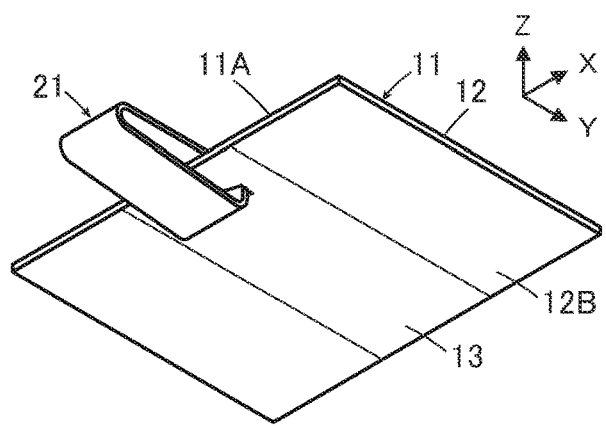
FIG. 2 is a perspective view of the connecting structure according to Embodiment 1 when viewed from an obliquely lower position.
Figure 3:
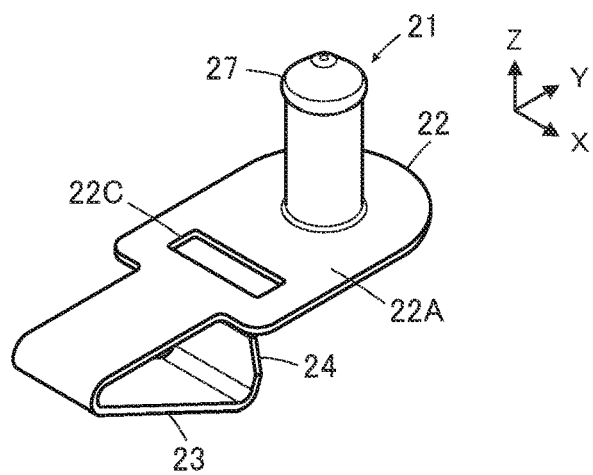
FIG. 3 is a perspective view showing a connection terminal used in the connecting structure of Embodiment 1.
Figure 4:
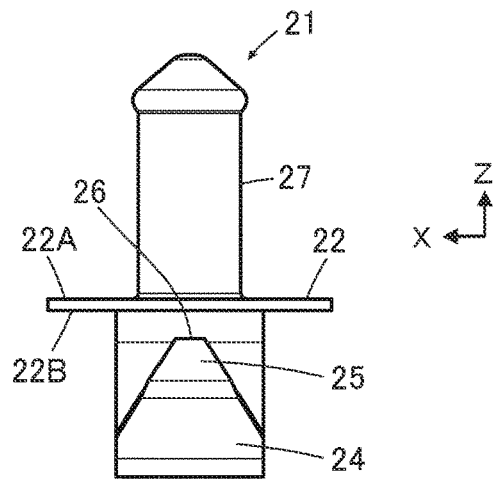
FIG. 4 is a front view showing the connection terminal used in the connecting structure of Embodiment 1.

FIGS. 1 and 2 illustrate a connecting structure according to Embodiment 1. In the connecting structure, a connection terminal 21 is connected to an end of a flexible substrate 11.

The flexible substrate 11 includes an insulating substrate main body 12 made of, for example, cloth or a resin film. The substrate main body 12 has a front surface 12A and a rear surface 12B facing in opposite directions to each other, and a conductive portion 13 is exposed on the rear surface 12B of the substrate main body 12.

The connection terminal 21 is made of a metal material and has conductivity. In addition, the connection terminal 21 extends in a direction perpendicular to an edge 11A of the flexible substrate 11 and is shaped such that the connection terminal 21 bends at the outside of the edge 11A of the flexible substrate 11 to reach the rear surface 12B of the substrate main body 12 from the front surface 12A of the substrate main body 12.

With the connecting structure as illustrated in FIGS. 1 and 2, the connection terminal 21 is held at the flexible substrate 11 and is electrically connected to the conductive portion 13 of the flexible substrate 11.

For ease of understanding, a plane along which the flexible substrate 11 extends is called "XY plane," a direction in which the connection terminal 21 extends over the flexible substrate 11 from the edge 11A of the flexible substrate 11 "+Y direction," and a direction extending perpendicularly to the flexible substrate 11 from the front surface 12A of the substrate main body 12 "+Z direction."

As illustrated in FIGS. 3 to 6, the connection terminal 21 includes a base portion 22 in a flat plate shape, an arm portion 23 bending at the −Y directional end of the base portion 22 in the −Z direction and extending in the +Y direction and the −Z direction, and a rising portion 24 extending from a tip end of the arm portion 23 toward the base portion 22 substantially in the +Z direction. The arm portion 23 has a constant X directional width. Meanwhile, the rising portion 24 is shaped such that the X directional width is the same as that of the arm portion 23 at a connected part connected to the arm portion 23 but becomes smaller toward the tip end in the +Z direction.

In addition, a tip end bending portion 25 extends from the tip end in the +Z direction of the rising portion 24. The tip end bending portion 25 extends in a direction inclined with respect to the rising portion 24 toward the −Y direction and has a trapezoidal shape in which the X directional width becomes smaller toward the tip end. At the tip end of the tip end bending portion 25, a pointed portion 26 that is sharply pointed is formed.

Figure 5:
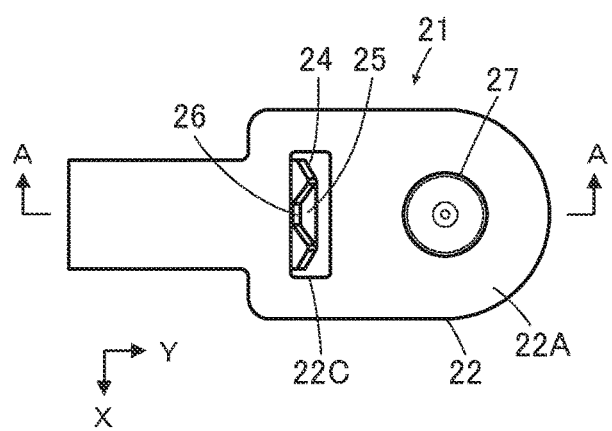
FIG. 5 is a plan view showing the connection terminal used in the connecting structure of Embodiment 1.

The base portion 22 has a front surface 22A facing the +Z direction and a rear surface 22B facing the −Z direction and is provided with a rectangular opening 22C penetrating from the front surface 22A to the rear surface 22B. The rising portion 24, the tip end bending portion 25 and the pointed portion 26 are positioned under the opening 22C, i.e., on the −Z direction side of the opening 22C. As shown in FIG. 5, the rising portion 24, the tip end bending portion 25 and the pointed portion 26 can be seen from the +Z direction side through the inside of the opening 22C. The opening 22C has a X directional width that is larger than that of the rising portion 24 and is configured such that, when the arm portion 23 is displaced relative to the base portion 22 so as to come close to the rear surface 22B of the base portion 22, the pointed portion 26 and the tip end bending portion 25 as well as a part of the rising portion 24 can protrude from the front surface 22A of the base portion 22 via the opening 22C.

In addition, a plug-type external connection portion 27 is formed on and projects from the front surface 22A of the base portion 22.

Figure 6:
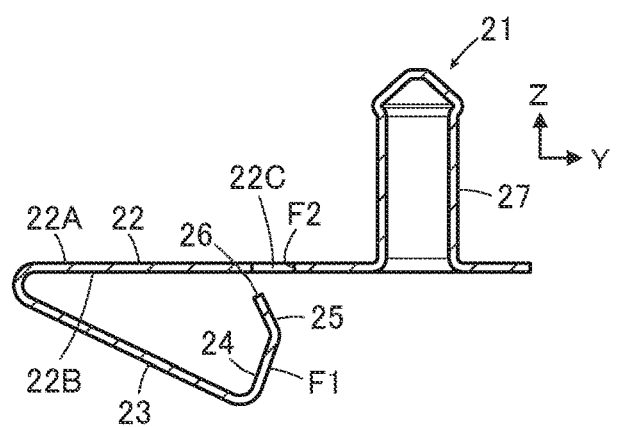
FIG. 6 is a cross-sectional view taken along line A-A in FIG. 5.

As illustrated in FIG. 6, a face of the rising portion 24 facing the +Y direction forms a pressing portion F1, while the +Y directional edge of the opening 22C in the base portion 22 forms a pressed portion F2.

Next, a method of connecting the connection terminal 21 to the flexible substrate 11 is described.

Figure 7:
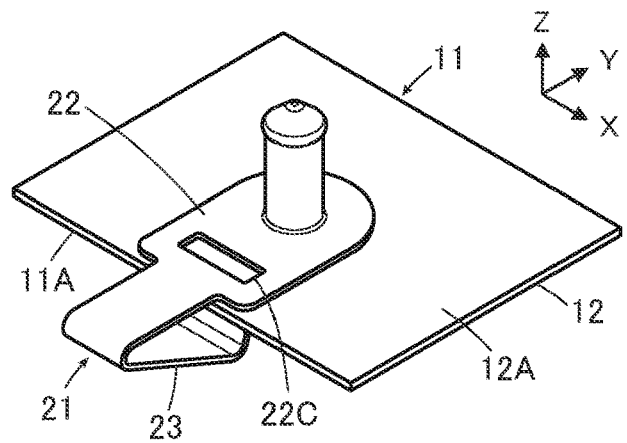
FIG. 7 is a perspective view showing a state where the connection terminal is positioned in relation to a flexible substrate in Embodiment 1.
Figure 8:
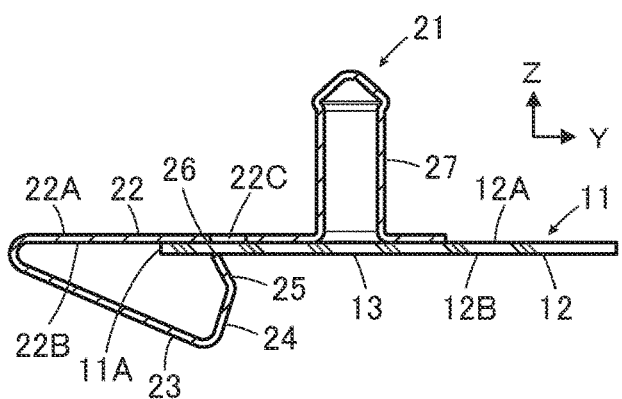
FIG. 8 is a cross-sectional view showing the state where the connection terminal is positioned in relation to the flexible substrate in Embodiment 1.

As illustrated in FIGS. 7 and 8, the connection terminal 21 is positioned in relation to the flexible substrate 11 such that the rear surface 22B of the base portion 22 in a flat plate shape of the connection terminal 21 is in contact with the front surface 12A of the substrate main body 12 of the flexible substrate 11.

In this process, the flexible substrate 11 and the connection terminal 21 are arranged such that the opening 22C in the base portion 22 of the connection terminal 21 does not deviate to the outside of the edge 11A of the flexible substrate 11 and is located on the +Z direction side of the conductive portion 13 that is exposed on the rear surface 12B of the substrate main body 12 of the flexible substrate 11. Accordingly, the pointed portion 26, the tip end bending portion 25 and the rising portion 24 are positioned under the opening 22C in the base portion 22 via the conductive portion 13 of the flexible substrate 11.

Figure 9:
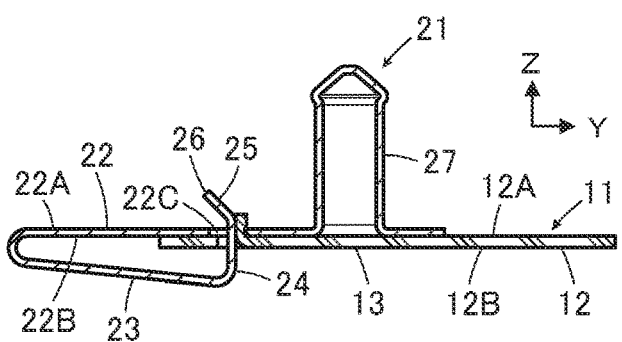
FIG. 9 is a cross-sectional view showing a state where the connection terminal is connected to the flexible substrate in Embodiment 1.
Figure 10:
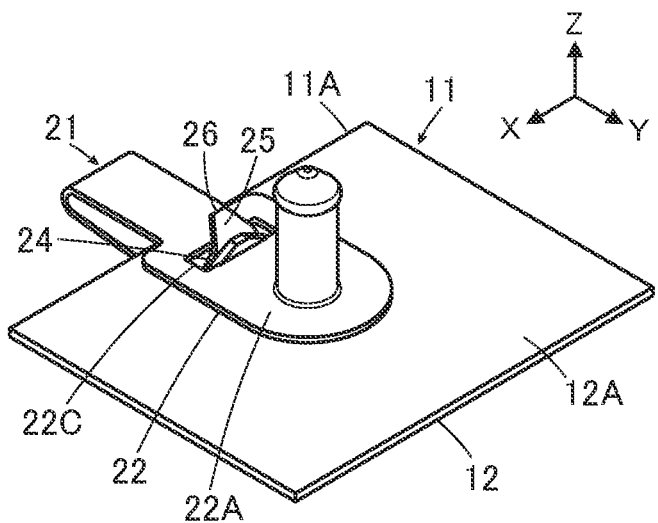
FIG. 10 is a perspective view showing the state where the connection terminal is connected to the flexible substrate in Embodiment 1.

In this positional relationship, when the arm portion 23 of the connection terminal 21 is displaced relatively to the base portion 22 so as to approach the rear surface 22B of the base portion 22, the rising portion 24 joined to the +Y directional end of the arm portion 23 as well as the tip end bending portion 25 and the pointed portion 26 is displaced in the +Z direction, and the pointed portion 26 cuts the flexible substrate 11 positioned under the opening 22C in the base portion 22. Then, the arm portion 23 is further displaced toward the base portion 22, whereby the pointed portion 26 and the tip end bending portion 25 of the connection terminal 21 pass through the cut part in the flexible substrate 11 and the opening 22C in the base portion 22 to project from the front surface 22A of the base portion 22, as illustrated in FIGS. 9 and 10. At this time, the rising portion 24 of the connection terminal 21 extends along an XZ plane, almost perpendicularly to the base portion 22.

Figure 11:
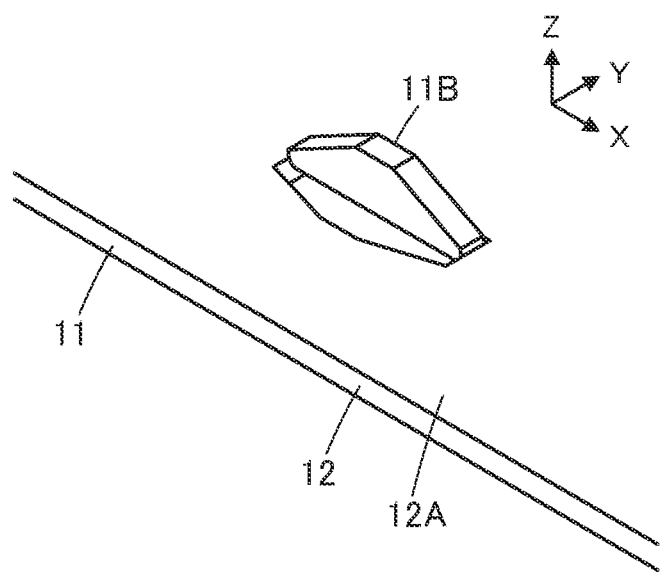
FIG. 11 is a partial perspective view showing the flexible substrate that is cut with the connection terminal.

Since the tip end bending portion 25 of the connection terminal 21 has a trapezoidal shape whose X directional width becomes smaller toward the pointed portion 26, when the flexible substrate 11 is cut with the pointed portion 26 of the connection terminal 21 and subsequently the tip end bending portion 25 of the connection terminal 21 is made to project in the +Z direction from the flexible substrate 11, a cut end part 11B in a trapezoidal shape is formed on the flexible substrate 11 as illustrated in FIG. 11. It should be noted that FIG. 11 shows the flexible substrate 11 with the connection terminal 21 being omitted in order to provide a clear view of the cut end part 11B.

Figure 12:
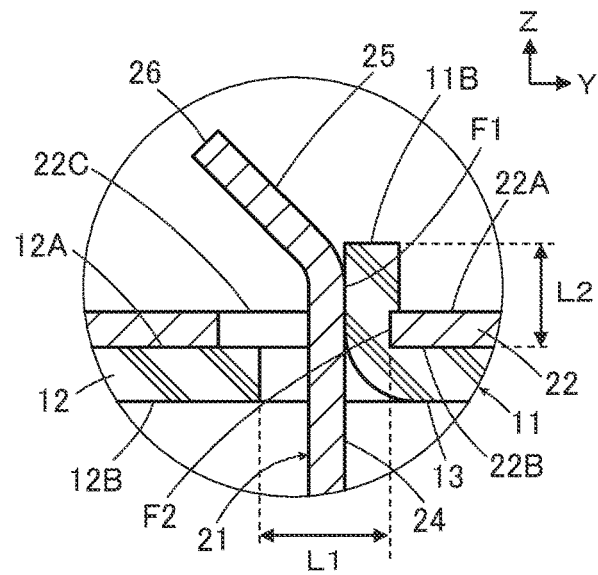
FIG. 12 is an enlarged view of an important part of FIG. 9.

At this time, as illustrated in FIG. 12, the cut end part 11B of the flexible substrate 11 cut with the pointed portion 26 of the connection terminal 21 is held between the pressing portion F1 formed of the face of the rising portion 24 facing the +Y direction and the pressed portion F2 formed of the +Y directional edge of the opening 22C in the base portion 22. Since the conductive portion 13 is exposed on the rear surface 12B of the substrate main body 12 of the flexible substrate 11, the conductive portion 13 present at the cut end part 11B comes into contact with the pressing portion F1 of the rising portion 24. The substrate main body 12 present at the cut end part 11B of the flexible substrate 11 is held between the pressing portion F1 and the pressed portion F2 to be elastically compressed in the thickness direction, whereby a given contact pressure is generated between the conductive portion 13 present at the cut end part 11B and the pressing portion F1. As a result, the connection terminal 21 is electrically connected to the conductive portion 13 of the flexible substrate 11.

Since the tip end bending portion 25 of the connection terminal 21 extends in a direction inclined with respect to the rising portion 24 toward the −Y direction, and the pointed portion 26 is formed at the tip end of the tip end bending portion 25, the flexible substrate 11 is cut with the pointed portion 26 in a length L1 in the Y direction. Hence, the cut end part 11B of the flexible substrate 11 held between the pressing portion F1 and the pressed portion F2 has a sufficient length L2 in the Z direction that corresponds to the cut length L1. Accordingly, it is possible to electrically connect the connection terminal 21 to the conductive portion 13 of the flexible substrate 11 with superior reliability.

As above, only with a single step of displacing the arm portion 23 of the connection terminal 21 positioned in relation to the flexible substrate 11 in the +Z direction, the holding of the connection terminal 21 at the flexible substrate 11 as well as the electrical connection between the connection terminal 21 and the conductive portion 13 of the flexible substrate 11 can be readily achieved.

Displacement of the arm portion 23 relatively to the base portion 22 of the connection terminal 21 may be derived from plastic deformation of the connection terminal 21 or elastic deformation thereof.

The connection terminal 21 connected to the flexible substrate 11 includes the plug-type external connection portion 27 formed on and projecting from the front surface 22A of the base portion 22 and can serve as a connector for connecting the conductive portion 13 of the flexible substrate 11 to an external device, a circuit or another. When a counter connector that is not shown is fitted with the connection terminal 21 so that the external connection portion 27 is connected to a contact of the counter connector, the electrical connection between the conductive portion 13 of the flexible substrate 11 and the contact of the counter connector is established via the external connection portion 27 of the connection terminal 21.

In Embodiment 1 as above, the conductive portion 13 of the flexible substrate 11 is exposed on the rear surface 12B of the substrate main body 12. However, the conductive portion 13 may be exposed on the front surface 12A of the substrate main body 12. In this case, the conductive portion 13 exposed on the front surface 12A of the substrate main body 12 is pressed against and comes into contact with the pressed portion F2 formed of the +Y directional edge of the opening 22C in the base portion 22 of the connection terminal 21, whereby the conductive portion 13 is electrically connected to the connection terminal 21.

The conductive portion 13 may also be exposed on both the front surface 12A and the rear surface 12B of the substrate main body 12 of the flexible substrate 11. In this case, the conductive portion 13 exposed on the rear surface 12B of the substrate main body 12 comes into contact with and electrically connected to the pressing portion F1 of the connection terminal 21, while the conductive portion 13 exposed on the front surface 12A of the substrate main body 12 comes into contact with and electrically connected to the pressed portion F2 of the connection terminal 21.

Embodiment 2

Figure 13:
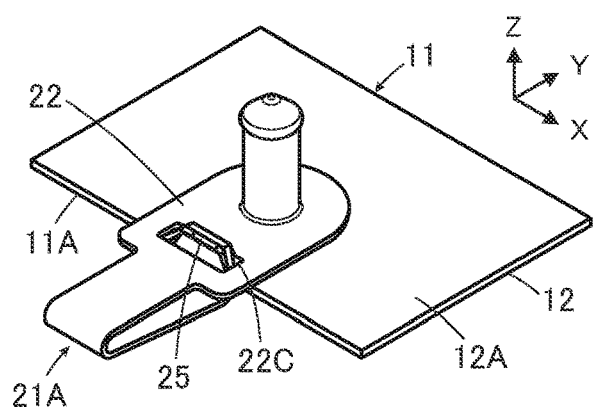
FIG. 13 is a perspective view showing a connecting structure according to Embodiment 2.

FIG. 13 illustrates a connecting structure according to Embodiment 2. In the connecting structure according to Embodiment 2, a connection terminal 21A is connected to an end of the flexible substrate 11. The connection terminal 21A is configured such that the pointed portion 26 formed at the tip end of the tip end bending portion 25 in the connection terminal 21 in Embodiment 1 is omitted but otherwise has the same configuration as the connection terminal 21.

Figure 14:
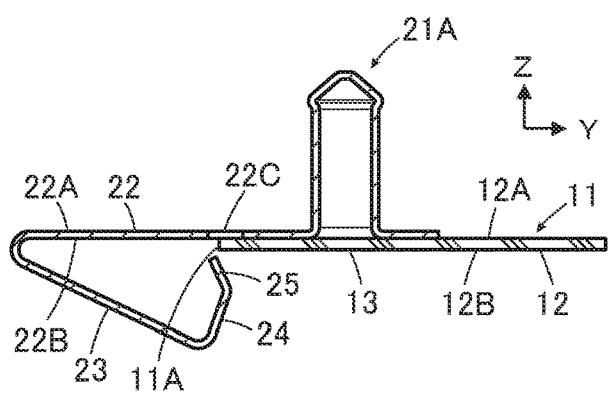
FIG. 14 is a cross-sectional view showing a state where the connection terminal is positioned in relation to the flexible substrate in Embodiment 2.

In Embodiment 2, the connection terminal 21A is positioned in relation to the flexible substrate 11 such that the rear surface 22B of the base portion 22 in a flat plate shape of the connection terminal 21A comes into contact with the front surface 12A of the substrate main body 12 of the flexible substrate 11 and the opening 22C in the base portion 22 is located at the edge 11A of the flexible substrate 11 as illustrated in FIG. 14. In other words, the tip end bending portion 25 and the rising portion 24 are located under the opening 22C in the base portion 22 via the edge 11A of the flexible substrate 11.

Figure 15:
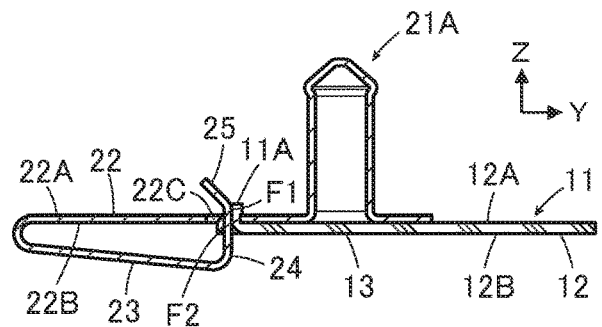
FIG. 15 is a cross-sectional view showing a state where the connection terminal is connected to the flexible substrate in Embodiment 2.

In this positional relationship, the arm portion 23 of the connection terminal 21A is displaced so as to displace the rising portion 24 and the tip end bending portion 25 in the +Z direction, whereby the tip end bending portion 25 of the connection terminal 21A passes through the opening 22C in the base portion 22 as catching the edge 11A of the flexible substrate 11 and projects from the front surface 22A of the base portion 22 as illustrated in FIG. 15. At this time, the edge 11A of the flexible substrate 11 is held between the pressing portion F1 formed of the face of the rising portion 24 facing the +Y direction and the pressed portion F2 formed of the +Y directional edge of the opening 22C in the base portion 22, and, at the edge 11A of the flexible substrate 11, the conductive portion 13 exposed on the rear surface 12B of the substrate main body 12 comes into contact with the pressing portion F1 of the rising portion 24. Accordingly, the connection terminal 21A is held at the flexible substrate 11 and also electrically connected to the conductive portion 13 of the flexible substrate 11.

In this manner, in Embodiment 2, the electrical connection between the connection terminal 21A and the conductive portion 13 of the flexible substrate 11 can be achieved without cutting the flexible substrate 11.

Embodiment 3

Figure 16:
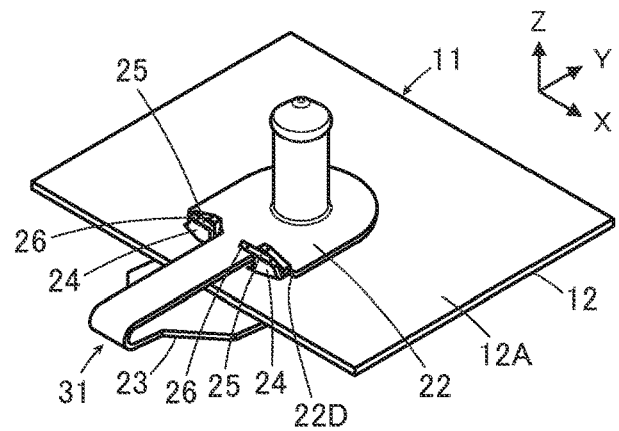
FIG. 16 is a perspective view showing a connecting structure according to Embodiment 3.
Figure 17:
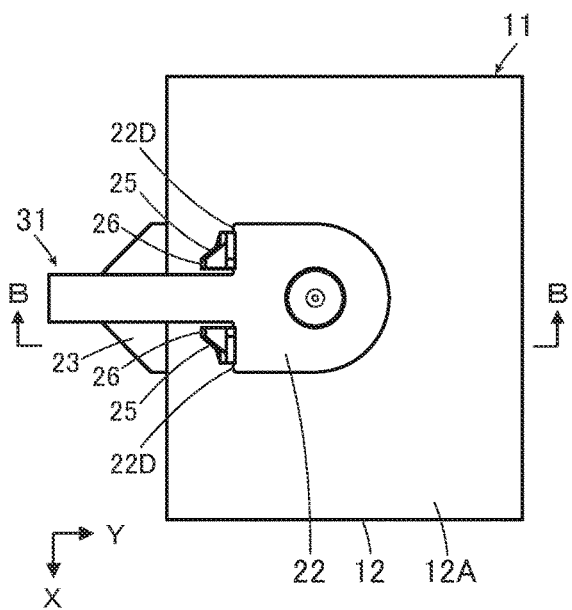
FIG. 17 is a plan view showing the connecting structure according to Embodiment 3.
Figure 18:
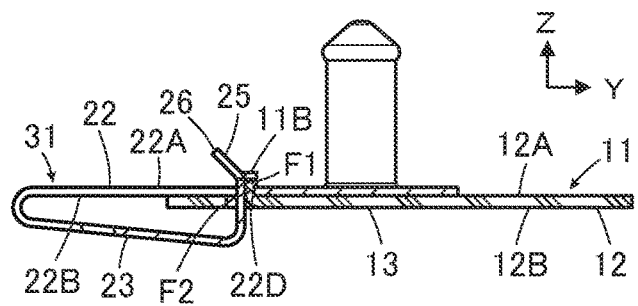
FIG. 18 is a cross-sectional view taken along line B-B in FIG. 17.

FIGS. 16 to 18 illustrate a connecting structure according to Embodiment 3. In the connecting structure according to Embodiment 3, a connection terminal 31 is connected to an end of the flexible substrate 11. The connection terminal 31 is configured such that the base portion 22 in the connection terminal 21 in Embodiment 1 includes, in place of the opening 22C, a pair of cutouts 22D formed separately on the +X direction side and the −X direction side of the base portion 22 and includes a pair of rising portions 24, a pair of tip end bending portions 25 and a pair of pointed portions 26 but otherwise has the same configuration as the connection terminal 21.

The pair of rising portions 24, the pair of tip end bending portions 25 and the pair of pointed portions 26 are arranged in the X direction so as to correspond to the pair of cutouts 22D of the base portion 22. The pressing portion F1 is formed of the face of each of the pair of rising portions 24 facing the +Y direction, while the pressed portion F2 is formed of an edge of each of the pair of cutouts 22D of the base portion 22.

With the connection terminal 31 being positioned in relation to the flexible substrate 11, when the arm portion 23 of the connection terminal 31 is displaced so as to displace the pair of rising portions 24, the pair of tip end bending portions 25 and the pair of pointed portions 26 in the +Z direction, as illustrated in FIG. 18, the pair of pointed portions 26 cut the flexible substrate 11, and the pair of tip end bending portions 25 project from the front surface 22A of the base portion 22. At this time, a pair of cut end parts 11B in the flexible substrate 11 cut with the pair of pointed portions 26 are each held between the pressing portion F1 formed of the face of the corresponding rising portion 24 facing the +Y direction and the pressed portion F2 formed of the edge of the corresponding cutout 22D of the base portion 22, and the conductive portion 13 exposed on the rear surface 12B of the substrate main body 12 comes into contact with the pair of pressing portions F1 of the pair of rising portions 24 at the pair of cut end parts 11B of the flexible substrate 11. Accordingly, the connection terminal 31 is held at the flexible substrate 11 and also electrically connected to the conductive portion 13 of the flexible substrate 11.

Embodiment 4

Figure 19:
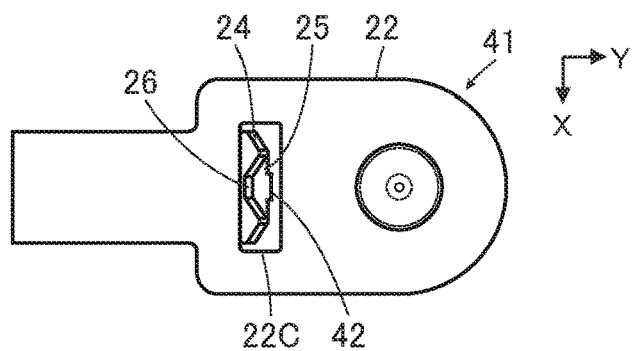
FIG. 19 is a plan view showing a connection terminal used in a connecting structure of Embodiment 4.
Figure 20:
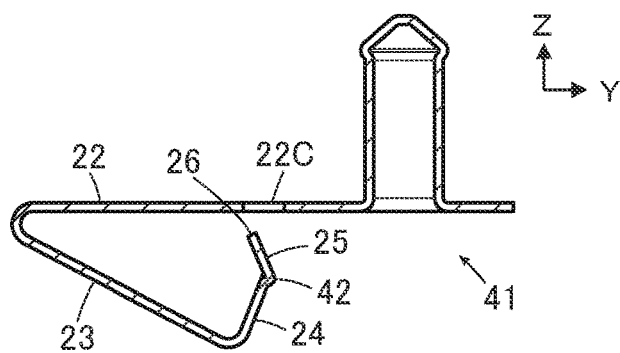
FIG. 20 is a cross-sectional view showing the connection terminal used in the connecting structure of Embodiment 4.

FIGS. 19 and 20 illustrate a connection terminal 41 according to Embodiment 4. The connection terminal 41 is configured such that a projection 42 projecting in the +Y direction opposite to the −Y direction in which the tip end bending portion 25 bends with respect to the rising portion 24 is formed at the root part of the tip end bending portion 25, i.e., at the boundary part between the rising portion 24 and the tip end bending portion 25 in the connection terminal 21 in Embodiment 1 but otherwise has the same configuration as the connection terminal 21.

Figure 21:
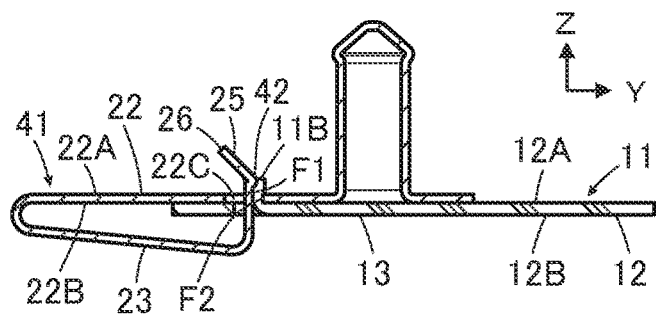
FIG. 21 is a cross-sectional view showing the connecting structure according to Embodiment 4.

With the connection terminal 41 being positioned in relation to the flexible substrate 11, when the arm portion 23 of the connection terminal 41 is displaced, as illustrated in FIG. 21, the pointed portion 26 cuts the flexible substrate 11, and the tip end bending portion 25 projects from the front surface 22A of the base portion 22. The cut end part 11B of the flexible substrate 11 cut with the pointed portion 26 is held between the pressing portion F1 formed of the face of the rising portion 24 facing in the +Y direction and the pressed portion F2 formed of an edge of the opening 22C in the base portion 22. Accordingly, the conductive portion 13 exposed on the rear surface 12B of the substrate main body 12 comes into contact with the pressing portion F1 at the cut end part 11B of the flexible substrate 11, whereby the connection terminal 41 is electrically connected to the conductive portion 13 of the flexible substrate 11.

At this time, since the connection terminal 41 includes the projection 42 formed at the root part of the tip end bending portion 25, even when the tip end bending portion 25 of the connection terminal 41 receives a pulling force to pull in the −Z direction from the opening 22C in the base portion 22, the projection 42 is caught by the edge of the opening 22C in the base portion 22, with the cut end part 11B of the flexible substrate 11 being held therebetween. Accordingly, the tip end bending portion 25 is prevented from being pulled out of the opening 22C in the base portion 22, and the highly reliable electrical connecting structure can be established between the connection terminal 41 and the conductive portion 13 of the flexible substrate 11.

Embodiment 5

In the connecting structure in Embodiment 1 described above, when the cut end part 11B of the flexible substrate 11 is held between the pressing portion F1 of the rising portion 24 and the pressed portion F2 of the opening 22C in the base portion 22 so that the connection terminal 21 and the conductive portion 13 of the flexible substrate 11 are electrically connected to each other, the rising portion 24 extends along an XZ plane, almost perpendicularly to the base portion 22, as illustrated in FIG. 9. The present invention, however, is not limited to the case.

Figure 22:
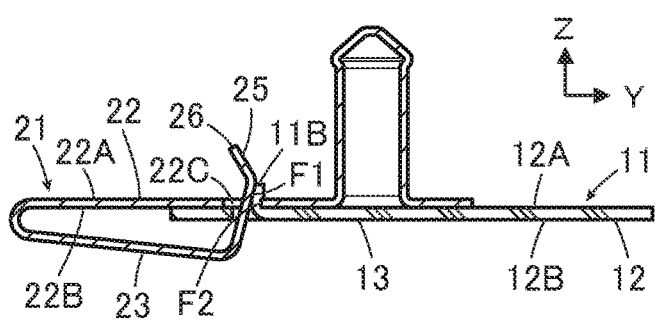
FIG. 22 is a cross-sectional view showing the connecting structure according to Embodiment 4.

As in Embodiment 5 illustrated in FIG. 22, in the state where the cut end part 11B of the flexible substrate 11 is held between the pressing portion F1 of the rising portion 24 and the pressed portion F2 of the opening 22C in the base portion 22 so that the connection terminal 21 is electrically connected to the conductive portion 13 of the flexible substrate 11, the rising portion 24 may extend in the +Y direction and the +Z direction to be inclined with respect to the base portion 22. Even in this case, the connection terminal 21 and the conductive portion 13 of the flexible substrate 11 can be electrically connected to each other.

Embodiment 6

Figure 23:
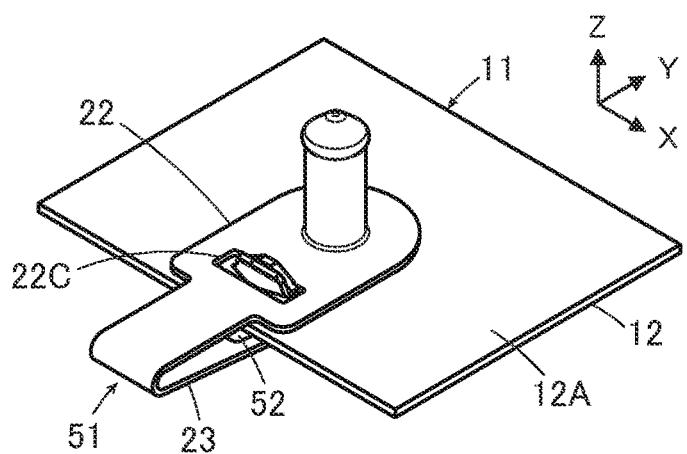
FIG. 23 is a perspective view of a connecting structure according to Embodiment 5 when viewed from an obliquely upper position.
Figure 24:
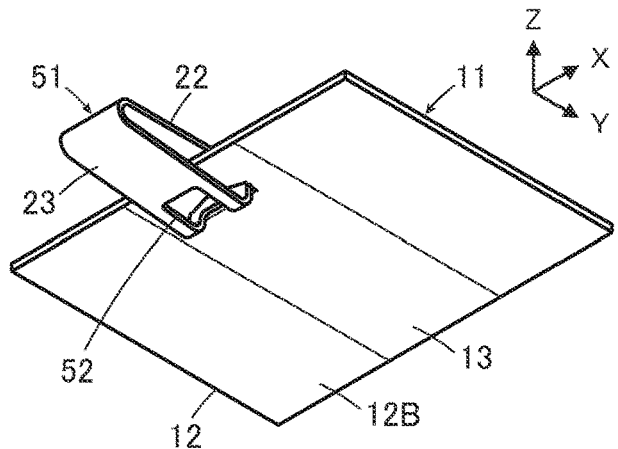
FIG. 24 is a perspective view of the connecting structure according to Embodiment 5 when viewed from an obliquely lower position.

FIGS. 23 to 24 illustrate a connecting structure according to Embodiment 6. In the connecting structure according to Embodiment 6, a connection terminal 51 is connected to an end of the flexible substrate 11. The connection terminal 51 is configured such that a through hole 52 is formed at the +Y directional end of the arm portion 23 joined to the rising portion 24 in the connection terminal 21 in Embodiment 1 but otherwise has the same configuration as the connection terminal 21.

The through hole 52 in the arm portion 23 is arranged slightly off the opening 22C in the base portion 22 to the −Y direction side.

Figure 25:
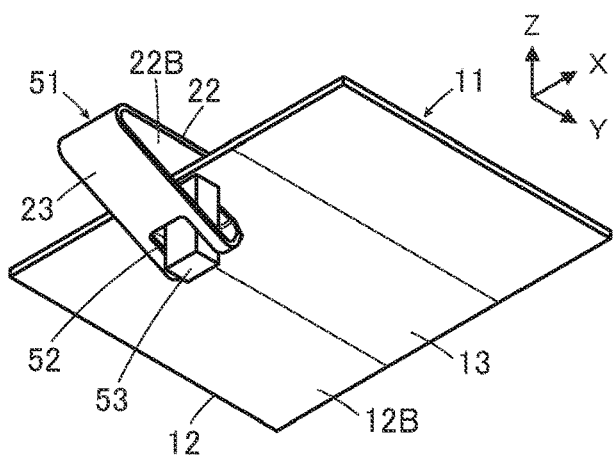
FIG. 25 is a perspective view showing a state where the flexible substrate is pressed against a base portion by means of a jig in Embodiment 5.
Figure 26:
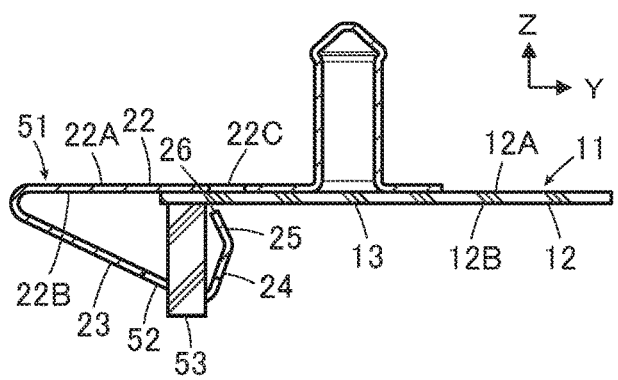
FIG. 26 is a cross-sectional view showing the state where the flexible substrate is pressed against the base portion by means of the jig in Embodiment 5.

When the connection terminal 51 is positioned in relation to the flexible substrate 11, as illustrated in FIGS. 25 and 26, a bar-shaped jig 53 is passed through the through hole 52 in the arm portion 23 from the −Z direction side and is pushed up in the +Z direction, whereby a part of the flexible substrate 11 located on the −Y direction side of the opening 22C in the base portion 22 is pressed against the rear surface 22B of the base portion 22.

When the arm portion 23 of the connection terminal 51 is displaced in this state, since the flexible substrate 11 is pressed against the rear surface 22B of the base portion 22, the pointed portion 26 can readily and securely cut the flexible substrate 11 to allow the tip end bending portion 25 to project from the front surface 22A of the base portion 22. In addition, similarly to the connection terminal 21 in Embodiment 1 illustrated in FIG. 9, the cut end part 11B of the flexible substrate 11 cut with the pointed portion 26 is held between the pressing portion F1 formed of the face of the rising portion 24 facing the +Y direction and the pressed portion F2 formed of an edge of the opening 22C in the base portion 22, whereby the connection terminal 51 is held at the flexible substrate 11 and also electrically connected to the conductive portion 13 of the flexible substrate 11.

Embodiment 7

Figure 27:
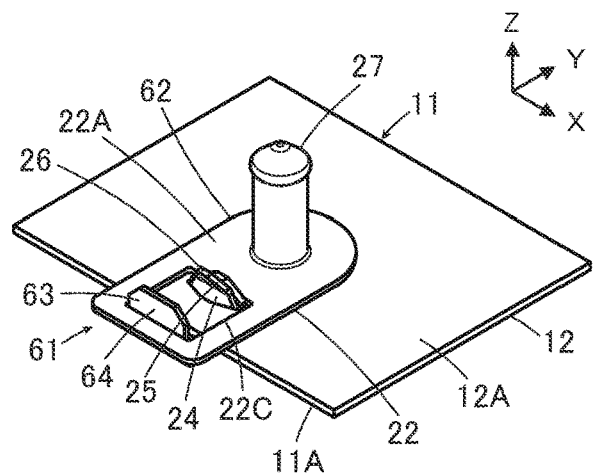
FIG. 27 is a perspective view of a connecting structure according to Embodiment 6 when viewed from an obliquely upper position.
Figure 28:
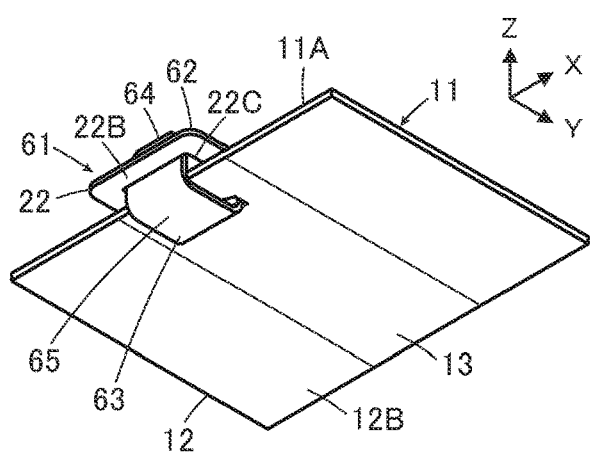
FIG. 28 is a perspective view of the connecting structure according to Embodiment 6 when viewed from an obliquely lower position.

FIGS. 27 to 28 illustrate a connecting structure according to Embodiment 7. In the connecting structure according to Embodiment 7, a connection terminal 61 is connected to an end of the flexible substrate 11. The connection terminal 61 is configured such that the base portion 22 and the rising portion 24 joined to each other via the arm portion 23 in the connection terminal 21 in Embodiment 1 are formed as separate members, and the base portion 22 and the rising portion 24 respectively comprise a first member 62 and a second member 63, which are each made of a metal material and have conductivity.

The first member 62 includes the base portion 22 in a flat plate shape and the plug-type external connection portion 27 formed on and projecting from the front surface 22A of the base portion 22. The base portion 22 is provided with a rectangular opening 22C penetrating from the front surface 22A to the rear surface 22B.

The second member 63 includes a holding portion 64 extending along an XZ plane that intersects the base portion 22 of the first member 62 and a joining portion 65 extending from the −Z directional end of the holding portion 64 in the +Y direction along the rear surface 22B of the base portion 22, and the rising portion 24 extending in the +Z direction is joined to the +Y directional end of the joining portion 65. The tip end bending portion 25 extends from the +Z directional end of the rising portion 24, and the pointed portion 26 is provided at the tip end of the tip end bending portion 25.

The opening 22C in the base portion 22 of the first member 62 has the X directional width that is larger than the X directional width of the second member 63.

For connecting the connection terminal 61 to the flexible substrate 11, first, the first member 62 is positioned in relation to the flexible substrate 11 such that the rear surface 22B of the base portion 22 in a flat plate shape of the first member 62 is in contact with the front surface 12A of the substrate main body 12 of the flexible substrate 11 while the opening 22C in the base portion 22 crosses the edge 11A of the flexible substrate 11 in the Y direction. In other words, the −Y directional edge of the opening 22C in the base portion 22 is positioned at the outside of the edge 11A of the flexible substrate 11.

Next, with the second member 63 being positioned on the −Z direction side of the opening 22C in the base portion 22 of the first member 62 via the flexible substrate 11, the +Z directional end of the holding portion 64 of the second member 63 is inserted to the opening 22C in the base portion 22 of the first member 62 that is positioned at the outside of the edge 11A of the flexible substrate 11 such that the +Z directional end of the holding portion 64 is brought into contact with the −Y directional edge of the opening 22C. At this time, the pointed portion 26 of the second member 63 opposes the rear surface 12B of the substrate main body 12 of the flexible substrate 11.

Figure 29:
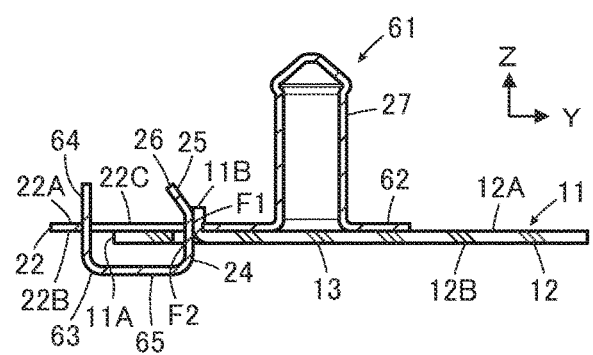
FIG. 29 is a cross-sectional view showing the connecting structure according to Embodiment 6.

In this state, while the holding portion 64 of the second member 63 is kept in contact with the −Y directional edge of the opening 22C in the base portion 22 of the first member 62, the second member 63 is pushed up in the +Z direction to displace the rising portion 24, the tip end bending portion 25 and the pointed portion 26 of the second member 63 in the +Z direction, whereby the flexible substrate 11 is cut with the pointed portion 26, and as illustrated in FIG. 29, the pointed portion 26 and the tip end bending portion 25 of the second member 63 pass through the cut part in the flexible substrate 11 and the opening 22C in the base portion 22 of the first member 62 to project from the front surface 22A of the base portion 22.

The cut end part 11B of the flexible substrate 11 cut with the pointed portion 26 of the second member 63 is held between the pressing portion F1 formed of the face of the rising portion 24 of the second member 63 facing the +Y direction and the pressed portion F2 formed of an edge of the opening 22C in the base portion 22 of the first member 62, and the conductive portion 13 exposed on the rear surface 12B of the substrate main body 12 comes into contact with the pressing portion F1 at the cut end part 11B of the flexible substrate 11, whereby the second member 63 is electrically connected to the conductive portion 13 of the flexible substrate 11.

At this time, since the holding portion 64 of the second member 63 is in contact with the −Y directional edge of the opening 22C in the base portion 22 of the first member 62, the second member 63 is electrically connected to the first member 62, and the connection terminal 61 is electrically connected to the conductive portion 13 of the flexible substrate 11. In other words, by means of the external connection portion 27 formed on and projecting from the base portion 22 of the first member 62, the conductive portion 13 of the flexible substrate 11 can be electrically connected to a contact of a counter connector that is not shown.

Embodiment 8

In Embodiment 7 described above, the external connection portion 27 is formed on the first member 62 of the connection terminal 61, but the present invention is not limited to the case.

Figure 30:
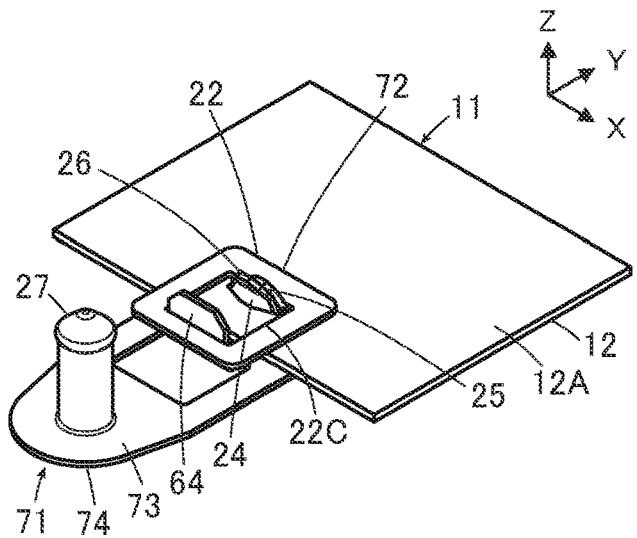
FIG. 30 is a perspective view of a connecting structure according to Embodiment 7 when viewed from an obliquely upper position.
Figure 31:
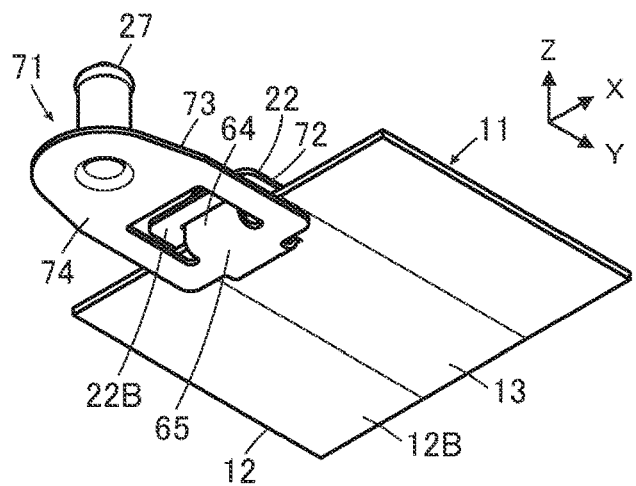
FIG. 31 is a perspective view of the connecting structure according to Embodiment 7 when viewed from an obliquely lower position.

FIGS. 30 to 31 illustrate a connecting structure according to Embodiment 8. In the connecting structure according to Embodiment 8, a connection terminal 71 is connected to an end of the flexible substrate 11. As with the connection terminal 61 in Embodiment 7, the connection terminal 71 includes a first member 72 and a second member 73 formed as separate members, which are each made of a metal material and have conductivity.

The first member 72 includes the base portion 22 in a flat plate shape provided with the rectangular opening 22C.

Meanwhile, the second member 73 includes the holding portion 64 extending along an XZ plane, the joining portion 65 extending from the −Z directional end of the holding portion 64 in the +Y direction, the rising portion 24 extending from the +Y directional end of the joining portion 65 in the +Z direction, the tip end bending portion 25 extending from the +Z directional end of the rising portion 24, and the pointed portion 26 provided at the tip end of the tip end bending portion 25. The second member 73 also includes a planar plate portion 74 extending from the joining portion 65 in the −Y direction along an XY plane, and the plug-type external connection portion 27 is formed on and projects from the planar plate portion 74.

Figure 32:
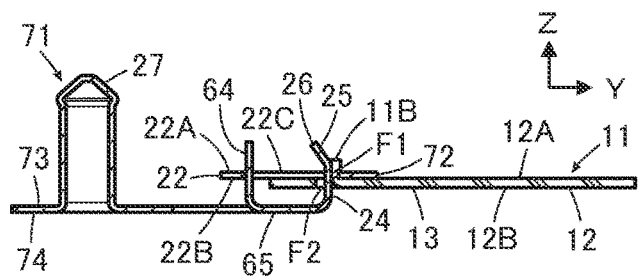
FIG. 32 is a cross-sectional view showing the connecting structure according to Embodiment 7.

The method of connecting the connection terminal 71 to the flexible substrate 11 is totally the same as the connecting method of the connection terminal 61 in Embodiment 7. That is, the first member 72 is positioned in relation to the flexible substrate 11, and the holding portion 64 of the second member 73 is inserted into the opening 22C in the base portion 22 of the first member 72 to be brought into contact with the −Y directional edge of the opening 22C. In this state, the second member 73 is pushed up in the +Z direction so that the pointed portion 26 cuts the flexible substrate 11, and the pointed portion 26 and the tip end bending portion 25 of the second member 73 pass through the cut part in the flexible substrate 11 and the opening 22C in the base portion 22 of the first member 72 to project from the front surface 22A of the base portion 22, as illustrated in FIG. 32.

In this manner, the cut end part 11B of the flexible substrate 11 cut with the pointed portion 26 is held between the pressing portion F1 formed of the face of the rising portion 24 of the second member 73 facing the +Y direction and the pressed portion F2 formed of an edge of the opening 22C in the base portion 22 of the first member 72, and the conductive portion 13 exposed on the rear surface 12B of the substrate main body 12B comes into contact with the pressing portion F1 at the cut end part 11B of the flexible substrate 11, whereby the second member 73 is electrically connected to the conductive portion 13 of the flexible substrate 11.

Since the external connection portion 27 is formed on and projects from the planar plate portion 74 of the second member 73, the conductive portion 13 of the flexible substrate 11 can be electrically connected to a contact of a counter connector that is not shown by means of the external connection portion 27.

Embodiment 9

Figure 33:
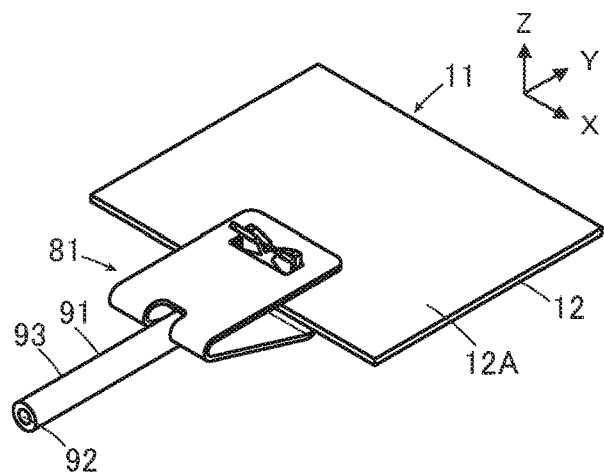
FIG. 33 is a perspective view of a connecting structure according to Embodiment 8 when viewed from an obliquely upper position.
Figure 34:
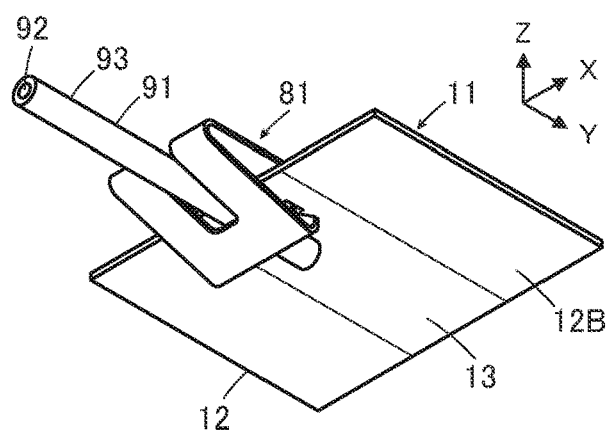
FIG. 34 is a perspective view of the connecting structure according to Embodiment 8 when viewed from an obliquely lower position.
Figure 35:
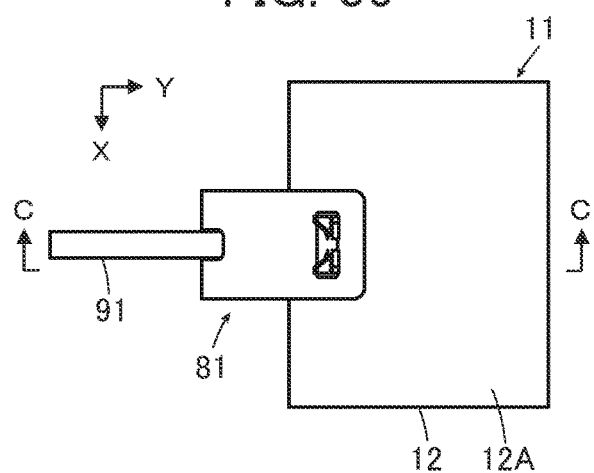
FIG. 35 is a plan view showing the connecting structure according to Embodiment 8.

FIGS. 33 to 35 illustrate a connecting structure according to Embodiment 9. In the connecting structure according to Embodiment 9, a connection terminal 81 is connected to an end of the flexible substrate 11, whereby a coated conductive wire 91 is connected to the conductive portion 13 of the flexible substrate 11 via the connection terminal 81. The coated conductive wire 91 has such a structure that the outer periphery of a conductor part 92 is covered with an insulator part 93.

Figure 36:
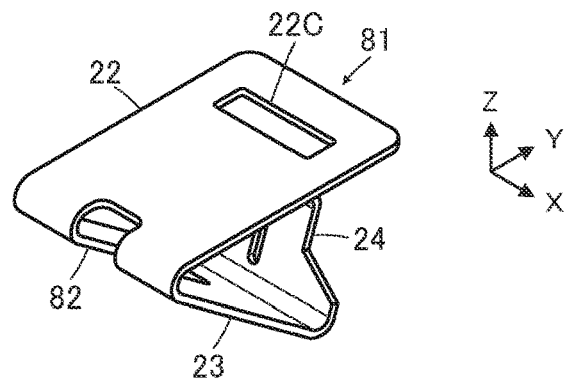
FIG. 36 is a perspective view showing a connection terminal used in the connecting structure of Embodiment 8.
Figure 37:
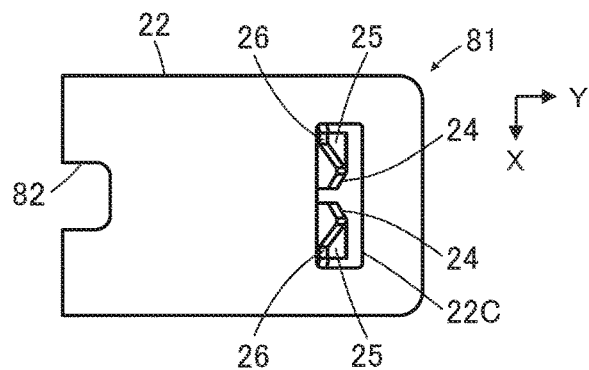
FIG. 37 is a plan view showing the connection terminal used in the connecting structure of Embodiment 8.
Figure 38:
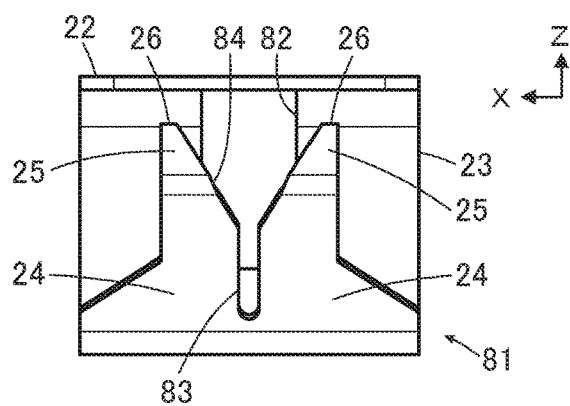
FIG. 38 is a front view showing the connection terminal used in the connecting structure of Embodiment 8.

As illustrated in FIGS. 36 to 38, as with the connection terminal 21 in Embodiment 1, the connection terminal 81 includes the base portion 22 in a flat plate shape provided with the rectangular opening 22C and the arm portion 23 bending from the −Y directional end of the base portion 22 toward the −Z direction and extending in the +Y direction and the −Z direction. In the arm portion 23, a slot 82 is formed to allow the coated conductive wire 91 to pass therethrough.

In addition, the connection terminal 81 includes a pair of rising portions 24 that are joined to the tip end of the arm portion 23 and divided in the X direction by a slit 83 extending in the Z direction, a pair of tip end bending portions 25 independently extending from the +Z directional tip ends of the pair of rising portions 24 in a direction inclined with respect to the rising portions 24 toward the −Y direction, and a pair of pointed portions 26 separately formed at the tip ends of the pair of tip end bending portions 25.

Moreover, a slit opening end 84 communicating with the slit 83 and opening in the +Z direction is formed between the +Z directional ends of the pair of rising portions 24 and between the pair of tip end bending portions 25.

The slit 83 has a slit width in the X direction that is slightly smaller than the diameter of the conductor part 92 of the coated conductive wire 91.

The slit opening end 84 has the X directional width that is larger than the slit width of the slit 83 and has a tapered shape with the X directional width increasing in the +Z direction. The X directional width of the slit opening end 84 at the pair of pointed portions 26 that are formed at the +Z directional ends of the pair of tip end bending portions 25 is designed to be larger than the diameter of the coated conductive wire 91.

Figure 39:
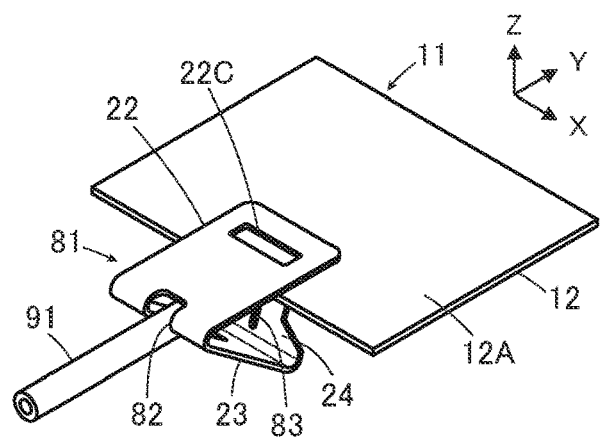
FIG. 39 is a perspective view showing a state where the connection terminal and a coated conductive wire are positioned in relation to the flexible substrate in Embodiment 8.

For connecting the connection terminal 81 to the flexible substrate 11, first, as illustrated in FIG. 39, the connection terminal 81 is positioned in relation to the flexible substrate 11 such that the base portion 22 in a flat plate shape of the connection terminal 81 comes into contact with the front surface 12A of the substrate main body 12 of the flexible substrate 11, while the coated conductive wire 91 is inserted though the slot 82 in the arm portion 23 of the connection terminal 81 such that the +Y directional end of the coated conductive wire 91 is positioned on the −Z direction side of the flexible substrate 11.

Figure 40:
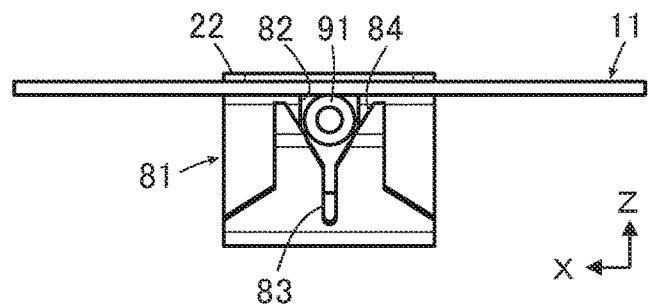
FIG. 40 is a front view showing the state where the connection terminal and the coated conductive wire are positioned in relation to the flexible substrate in Embodiment 8.

At this time, as illustrated in FIG. 40, the +Y directional end of the coated conductive wire 91 passes through the slit opening end 84 of the connection terminal 81 and extends in the +Y direction.

Figure 41:
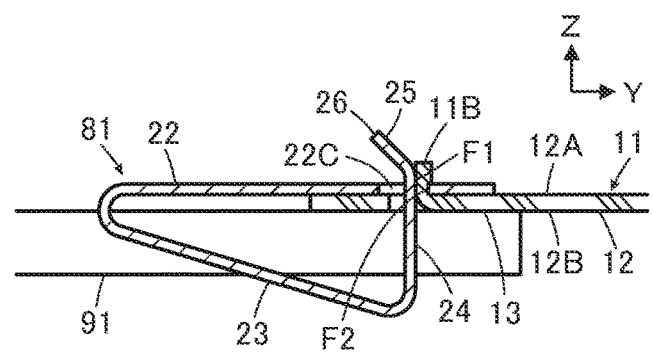
FIG. 41 is a cross-sectional view taken along line C-C in FIG. 35.

In this state, when the arm portion 23 of the connection terminal 81 is displaced so as to displace the pair of rising portions 24, the pair of tip end bending portions 25 and the pair of pointed portions 26 in the +Z direction, as illustrated in FIG. 41, the pair of pointed portions 26 cut the flexible substrate 11, and the pair of tip end bending portions 25 project from the base portion 22 on the +Z direction side. At this time, a pair of cut end parts 11B of the flexible substrate 11 cut with the pair of pointed portions 26 are each held between the pressing portion F1 formed of the face of the corresponding rising portion 24 facing the +Y direction and the pressed portion F2 formed of an edge of the opening 22C in the base portion 22, and the conductive portion 13 exposed on the rear surface 12B of the substrate main body 12 is in contact with the pair of pressing portions F1 of the rising portions 24 at the pair of cut end parts 11B of the flexible substrate 11. Accordingly, the connection terminal 81 is electrically connected to the conductive portion 13 of the flexible substrate 11.

Figure 42:
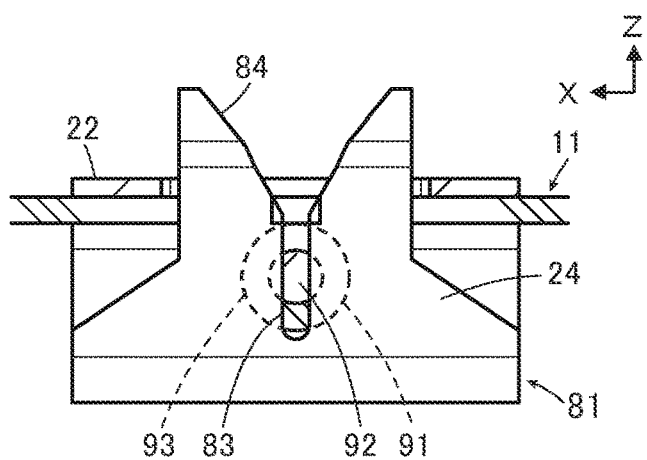
FIG. 42 is a cross-sectional front view showing the connecting structure according to Embodiment 8.

In addition, displacement of the arm portion 23 of the connection terminal 81 in the +Z direction causes the slit opening end 84 of the connection terminal 81 to move relatively to the coated conductive wire 91 in the +Z direction, whereby the insulator part 93 covering the outer periphery of the conductor part 92 of the coated conductive wire 91 is gradually cut and torn by the edge of the slit opening end 84. When the coated conductive wire 91 reaches the slit 83 communicating with the slit opening end 84 of the connection terminal 81, since the slit 83 has the slit width in the X direction slightly smaller than the diameter of the conductor part 92 of the coated conductive wire 91, as illustrated in FIG. 42, the insulator part 93 of the coated conductive wire 91 is cut and torn by the edge of the slit 83. Accordingly, the connection terminal 81 comes into contact with and is electrically connected to the conductor part 92 of the coated conductive wire 91.

As above, in the state where the connection terminal 81 is positioned in relation to the flexible substrate 11, and the coated conductive wire 91 is passed through the slot 82 in the arm portion 23 of the connection terminal 81, only with a single step of moving the arm portion 23 of the connection terminal 81 in the +Z direction, the holding of the connection terminal 81 and the coated conductive wire 91 at the flexible substrate 11 as well as the electrical connection between the conductive portion 13 of the flexible substrate 11 and the conductor part 92 of the coated conductive wire 91 via the connection terminal 81 can be achieved.

Embodiment 10

Figure 43:
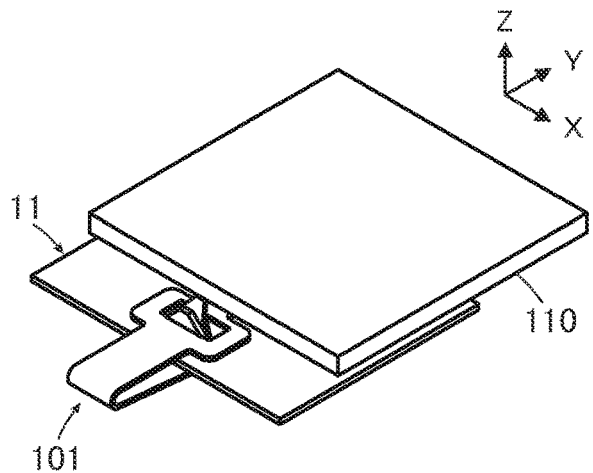
FIG. 43 is a perspective view showing a connecting structure according to Embodiment 9.

FIG. 43 illustrates a connecting structure according to Embodiment 10. In the connecting structure according to Embodiment 10, a circuit board 110 is connected to the flexible substrate 11 via a connection terminal 101 that is connected to an end of the flexible substrate 11.

Figure 44:
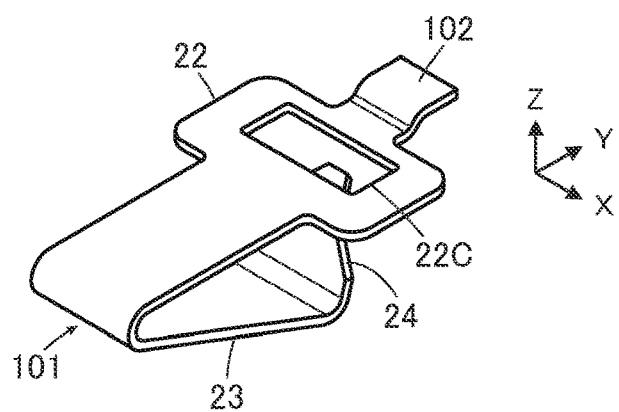
FIG. 44 is a perspective view of a connection terminal used in the connecting structure of Embodiment 9 when viewed from an obliquely upper position.
Figure 45:
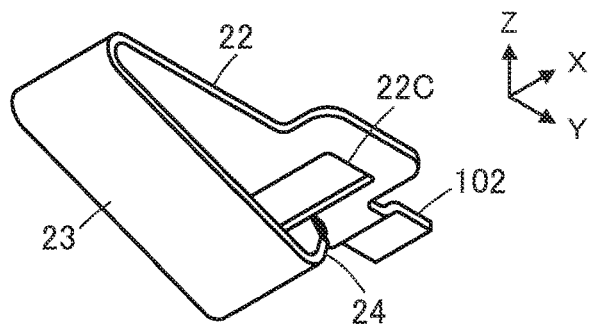
FIG. 45 is a perspective view of the connection terminal used in the connecting structure of Embodiment 9 when viewed from an obliquely lower position.
Figure 46:
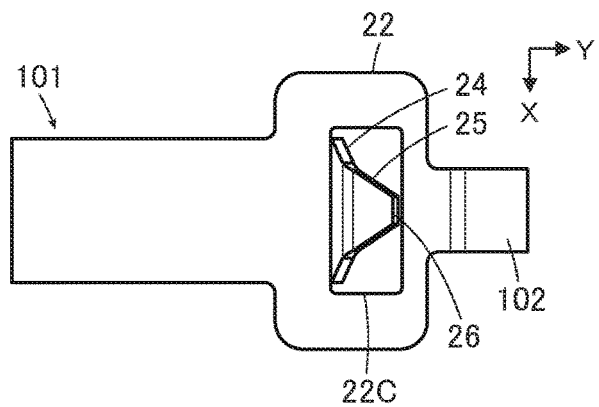
FIG. 46 is a plan view showing the connection terminal used in the connecting structure of Embodiment 9.

As illustrated in FIGS. 44 to 46, the connection terminal 101 is configured such that, in place of the plug-type external connection portion 27 formed on and projecting from the base portion 22 in the connection terminal 21 in Embodiment 1, a circuit board connection portion 102 in a flat plate shape is formed at the +Y directional end of the base portion 22, and the tip end bending portion 25 extends in a direction inclined with respect to the rising portion 24 toward the +Y direction but otherwise has the same configuration as the connection terminal 21.

Figure 47:
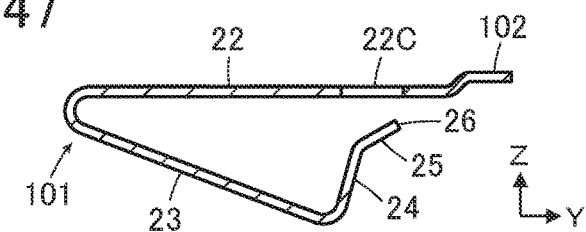
FIG. 47 is a cross-sectional view showing the connection terminal used in the connecting structure of Embodiment 9.

As illustrated in FIG. 47, the circuit board connection portion 102 of the connection terminal 101 is positioned in parallel with the base portion 22 and on the +Z direction side of the base portion 22.

Figure 48:
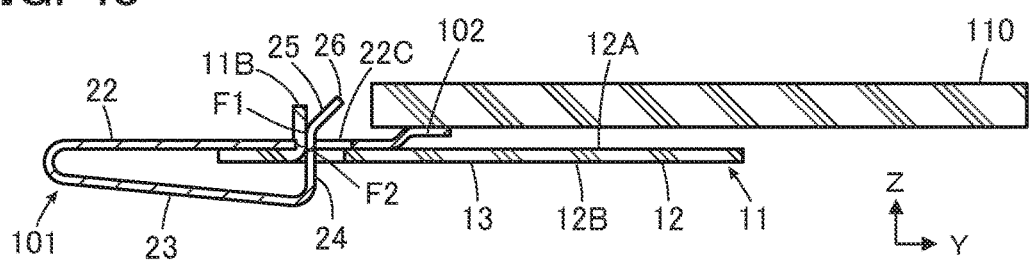
FIG. 48 is a cross-sectional view showing the connecting structure according to Embodiment 9.
Figure 49:
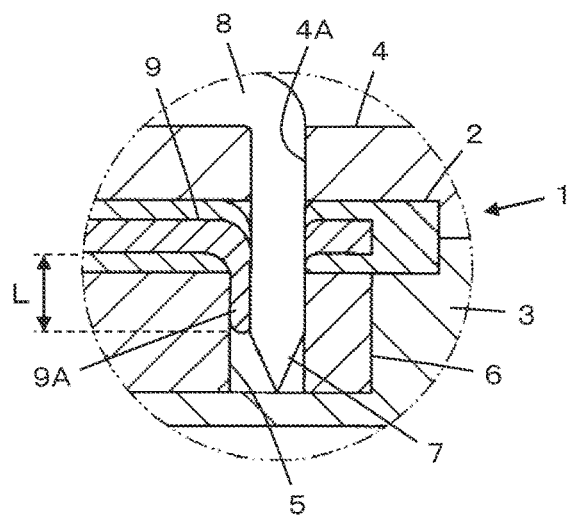
FIG. 49 is a partial cross-sectional view showing a conventional connecting structure.

The method of connecting the connection terminal 101 to the flexible substrate 11 is totally the same as the connecting method of the connection terminal 21 in Embodiment 1. That is, the connection terminal 101 is positioned in relation to the flexible substrate 11, the arm portion 23 of the connection terminal 101 is displaced in the +Z direction so that the pointed portion 26 cuts the flexible substrate 11, and the pointed portion 26 and the tip end bending portion 25 of the connection terminal 101 pass through the cut part of the flexible substrate 11 to project from the base portion 22 on the +Z direction side, as illustrated in FIG. 48.

The cut end part 11B of the flexible substrate 11 cut with the pointed portion 26 is held between the pressing portion F1 formed of the face of the rising portion 24 facing the −Y direction and the pressed portion F2 formed of the −Y directional edge of the opening 22C in the base portion 22, and the conductive portion 13 exposed on the rear surface 12B of the substrate main body 12 comes into contact with the pressing portion F1 of the rising portion 24 at the cut end part 11B of the flexible substrate 11. Accordingly, the connection terminal 101 is electrically connected to the conductive portion 13 of the flexible substrate 11.

By connecting the circuit board connection portion 102 of the connection terminal 101 that is connected to the flexible substrate 11 as above to a connection pad (not shown) that is exposed on the −Z direction side surface of the circuit board 110 through soldering or another process, the conductive portion 13 of the flexible substrate 11 can be connected to the circuit board 110 via the connection terminal 101.

Contrary to the tip end bending portion 25 of the connection terminal 21 in Embodiment 1, the tip end bending portion 25 of the connection terminal 101 extends in a direction inclined with respect to the rising portion 24 toward the +Y direction; even when the connection terminal 101 configured as above is used, the flexible substrate 11 would be cut with the pointed portion 26 formed at the tip end of the rising portion 24 in a given length in the Y direction. Accordingly, the cut end part 11B of the flexible substrate 11 held between the pressing portion F1 formed of the face on the −Y direction side of the rising portion 24 and the pressed portion F2 formed of the −Y directional edge of the opening 22C in the base portion 22 has a sufficient length in the Z direction that corresponds to the given length of the cut, allowing the connection terminal 101 to be electrically connected to the conductive portion 13 of the flexible substrate 11 with superior reliability.

In addition, as with the connection terminal 21 in Embodiment 1, the connection terminal 101 in Embodiment 10 may have the tip end bending portion 25 extending in a direction inclined with respect to the rising portion 24 toward the −Y direction.

While the above connection terminals 21, 21A, 31, 41, 51, 61 and 71 in Embodiments 1 to 8 each have the plug-type external connection portion 27, the invention is not limited thereto, and a receptacle-type external connection portion may be provided instead.

What is claimed is:

1. A connecting method for connecting a connection terminal having conductivity to an end of a flexible substrate, the flexible substrate having a conductive portion exposed on at least one of surfaces of the flexible substrate, the method comprising:
    arranging the connection terminal such that a rear surface of a base portion in a flat plate shape of the connection terminal comes into contact with a front surface of the flexible substrate;
    with a rising portion of the connection terminal extending from the rear surface side of the base portion toward the base portion and a tip end bending portion of the connection terminal extending from a tip end of the rising portion in a direction inclined with respect to the rising portion toward a −Y direction, displacing the rising portion toward the base portion so that the tip end bending portion protrudes from a front surface of the base portion; and
    holding a part of the flexible substrate between a pressing portion formed at the rising portion by a face of the rising portion facing a +Y direction and a pressed portion formed at the base portion by a +Y directional edge of an opening in the base portion to elastically compress in a thickness direction thereof, whereby the conductive portion of the flexible substrate is electrically connected to at least one of the pressing portion and the pressed portion.

2. The connecting method according to claim 1, wherein when the rising portion is displaced toward the base portion, the flexible substrate is cut with a pointed portion disposed at a tip end of the tip end bending portion of the connection terminal, the tip end bending portion protrudes from the front surface of the base portion, and a cut end part of the flexible substrate cut with the pointed portion is held between the pressing portion and the pressed portion.

3. The connecting method according to claim 1, wherein when the rising portion is displaced toward the base portion, the tip end bending portion of the connection terminal protrudes from the front surface of the base portion as catching an edge of the flexible substrate, and the edge of the flexible substrate caught by the tip end bending portion is held between the pressing portion and the pressed portion.

4. A connecting structure, in which a connection terminal having conductivity is connected to an end of a flexible substrate, the flexible substrate having a conductive portion exposed on at least one of surfaces of the flexible substrate,
    wherein the connection terminal includes a base portion in a flat plate shape having a front surface and a rear surface facing in opposite directions to each other, a rising portion extending from the rear surface side of the base portion toward the base portion, and a tip end bending portion extending from a tip end of the rising portion in a direction inclined with respect to the rising portion toward a −Y direction,
    wherein the rising portion includes a pressing portion formed by a face of the rising portion facing a +Y direction,
    wherein the base portion includes a pressed portion formed by a +Y directional edge of an opening in the base portion, and
    wherein, the base portion, the rising portion and the tip end bending portion are configured such that with the rear surface of the base portion being in contact with a front surface of the flexible substrate, a part of the flexible substrate is held between the pressing portion and the pressed portion to be elastically compressed in a thickness direction thereof, whereby the conductive portion of the flexible substrate is electrically connected to at least one of the pressing portion and the pressed portion.

5. A connection terminal having conductivity and connected to an end of a flexible substrate, the flexible substrate having a conductive portion exposed on at least one of surfaces of the flexible substrate, the connection terminal comprising:
    a base portion in a flat plate shape having a front surface and a rear surface facing in opposite directions to each other;
    a rising portion extending from the rear surface side of the base portion toward the base portion; and
    a tip end bending portion extending from a tip end of the rising portion in a direction inclined with respect to the rising portion toward a −Y direction,
    wherein the rising portion includes a pressing portion formed by a face of the rising portion facing a +Y direction,
    wherein the base portion includes a pressed portion formed by a face of the rising portion facing a +Y direction, and wherein, the base portion, the rising portion and the tip end bending portion are configured such that with the rear surface of the base portion being in contact with a front surface of the flexible substrate, a part of the flexible substrate is held between the pressing portion and the pressed portion to be elastically compressed in a thickness direction thereof, whereby the conductive portion of the flexible substrate is electrically connected to at least one of the pressing portion and the pressed portion.

6. The connection terminal according to claim 5, further comprising an arm portion bending and extending from an end of the base portion to the rear surface side of the base portion, wherein the rising portion is joined to a tip end of the arm portion.

7. The connection terminal according to claim 6, wherein the arm portion is provided with a through hole through which a jig passes to press the flexible substrate against the rear surface of the base portion.

8. The connection terminal according to claim 5, further comprising:

a first member including the base portion; and a second member separated from the first member and including the rising portion and the tip end bending portion, wherein the second member includes a holding portion extending in a direction that intersects the base portion and contacting the base portion so as to be held at the base portion, and a joining portion extending along the rear surface of the base portion and joining the holding portion to the rising portion.

9. The connection terminal according to claim 8, comprising an external connection portion formed on the first member.

10. The connection terminal according to claim 8, comprising an external connection portion formed on the second member.

11. The connection terminal according to claim 5, comprising a pointed portion disposed at a tip end of the tip end bending portion and used to cut the flexible substrate.

12. The connection terminal according to claim 5, wherein the opening in the base portion is a through hole or a cutout provided in the base portion.

13. The connection terminal according to claim 5, wherein a projection is formed at a root part of the tip end bending portion, the projection projecting in an opposite direction to a direction in which the tip end bending portion bends with respect to the rising portion.

14. The connection terminal according to claim 5, wherein, when the conductive portion of the flexible substrate is electrically connected to at least one of the pressing portion and the pressed portion, the rising portion is perpendicular to the base portion.

15. The connection terminal according to claim 5, wherein, when the conductive portion of the flexible substrate is electrically connected to at least one of the pressing portion and the pressed portion, the rising portion is inclined with respect to the base portion.

16. The connection terminal according to claim 5, wherein the rising portion has a slit for receiving a coated conductive wire that has a conductor part covered by an insulator part, and wherein, when the coated conductive wire is inserted to the slit, an edge of the slit cuts and tears the insulator part of the coated conductive wire, whereby the rising portion is electrically connected to the conductor part.

17. The connection terminal according to claim 16, wherein the rising portion is divided into halves by the slit, and the tip end bending portion is disposed at each of tip ends of the divided rising portion.

18. The connection terminal according to claim 5, wherein the base portion includes a circuit board connection portion, and wherein the conductive portion of the flexible substrate is electrically connected to a circuit board via the circuit board connection portion.

* * * * *